(12) United States Patent
Kapoor et al.

(10) Patent No.: US 7,683,433 B2
(45) Date of Patent: Mar. 23, 2010

(54) APPARATUS AND METHOD FOR IMPROVING DRIVE-STRENGTH AND LEAKAGE OF DEEP SUBMICRON MOS TRANSISTORS

(75) Inventors: Ashok Kumar Kapoor, Palo Alto, CA (US); Robert Strain, San Jose, CA (US); Reuven Marko, Netanya (IL)

(73) Assignee: Semi Solution, LLC, Los Gatos, CA (US)

( * ) Notice: Subject to any disclaimer, the term of this patent is extended or adjusted under 35 U.S.C. 154(b) by 410 days.

(21) Appl. No.: 11/533,332

(22) Filed: Sep. 19, 2006

(65) Prior Publication Data

US 2007/0069306 A1 Mar. 29, 2007

Related U.S. Application Data

(63) Continuation-in-part of application No. 11/029,542, filed on Jan. 4, 2005, now Pat. No. 7,224,205.

(60) Provisional application No. 60/585,582, filed on Jul. 7, 2004, provisional application No. 60/601,979, filed on Aug. 17, 2004, provisional application No. 60/717,769, filed on Sep. 19, 2005.

(51) Int. Cl.
*H01L 29/76* (2006.01)
*H01L 31/062* (2006.01)
*H01L 31/113* (2006.01)
*H01L 31/119* (2006.01)

(52) U.S. Cl. .............. 257/379; 257/360; 257/364; 323/265; 323/273

(58) Field of Classification Search .............. 257/360, 257/364, 369, 379, 385; 323/265, 266, 273, 323/282

See application file for complete search history.

(56) References Cited

U.S. PATENT DOCUMENTS 3,921,035 A * 11/1975 Holmes .................. 315/307

(Continued)

FOREIGN PATENT DOCUMENTS

TW 419854 1/2001

(Continued)

OTHER PUBLICATIONS

Vora, M. et al; "A 2 Micron High Performance Bipolar 64K ECL Static RAM Technology With 200 Square Microns Contactless Memory Cell", IEDM Technical Digest 1984, pp. 690-693.

(Continued)

*Primary Examiner*—Phuc T Dang
(74) *Attorney, Agent, or Firm*—Michael A. Glenn; Glenn Patent Group

(57) ABSTRACT

An apparatus and method of manufacture for metal-oxide semiconductor (MOS) transistors is disclosed. Devices in accordance with the invention are operable at voltages below 2V. The devices are area efficient, have improved drive strength, and have reduced leakage current. A dynamic threshold voltage control scheme comprised of a forward biased diode in parallel with a capacitor is used, implemented without changing the existing MOS technology process. This scheme controls the threshold voltage of each transistor. In the OFF state, the magnitude of the threshold voltage of the transistor increases, keeping the transistor leakage to a minimum. In the ON state, the magnitude of the threshold voltage decreases, resulting in increased drive strength. The invention is particularly useful in MOS technology for both bulk and silicon on insulator (SOI) CMOS. The use of reverse biasing of the well, in conjunction with the above construct to further decrease leakage in a MOS transistor, is also shown.

49 Claims, 10 Drawing Sheets

U.S. PATENT DOCUMENTS

| | | | |
|---|---|---|---|
| 4,412,308 | A | 10/1983 | Bereron |
| 4,418,468 | A | 12/1983 | Vora et al. |
| 4,616,404 | A | 10/1986 | Wang et al. |
| 4,679,170 | A | 7/1987 | Bourassa et al. |
| 5,168,337 | A | 12/1992 | Muto et al. |
| 5,266,831 | A | 11/1993 | Phipps et al. |
| 5,365,102 | A | 11/1994 | Mehrotra et al. |
| 5,416,443 | A * | 5/1995 | Cranford et al. ............... 331/2 |
| 5,559,451 | A * | 9/1996 | Okamura .................... 326/84 |
| 5,717,237 | A | 2/1998 | Chi |
| 5,753,955 | A | 5/1998 | Fechner |
| 5,760,449 | A | 6/1998 | Welch |
| 5,763,960 | A * | 6/1998 | Ceccherelli et al. ........... 307/41 |
| 5,804,470 | A | 9/1998 | Wollesen |
| 5,821,769 | A | 10/1998 | Douseki |
| 5,856,708 | A | 1/1999 | Wollesen |
| 6,018,168 | A | 1/2000 | Yang |
| 6,034,563 | A | 3/2000 | Mashiko |
| 6,081,107 | A * | 6/2000 | Marino ....................... 323/282 |
| 6,177,703 | B1 | 1/2001 | Cunningham |
| 6,194,276 | B1 | 2/2001 | Chan et al. |
| 6,198,173 | B1 | 3/2001 | Huang |
| 6,204,105 | B1 | 3/2001 | Jung |
| 6,225,827 | B1 | 5/2001 | Fujii et al. |
| 6,232,163 | B1 | 5/2001 | Voldmann et al. |
| 6,294,816 | B1 * | 9/2001 | Baukus et al. ............... 257/368 |
| 6,359,477 | B1 | 3/2002 | Pathak |
| 6,384,639 | B1 | 5/2002 | Chen et al. |
| 6,411,560 | B1 | 6/2002 | Tanizaki et al. |
| 6,429,482 | B1 | 8/2002 | Culp et al. |
| 6,441,647 | B2 | 8/2002 | Jeon |
| 6,465,849 | B1 | 10/2002 | Chang et al. |
| 6,521,948 | B2 | 2/2003 | Ebina |
| 6,593,799 | B2 | 7/2003 | De et al. |
| 6,600,187 | B2 | 7/2003 | Kim |
| 6,621,292 | B2 | 9/2003 | Sakata et al. |
| 6,628,551 | B2 | 9/2003 | Jain |
| 6,643,199 | B1 | 11/2003 | Tang et al. |
| 6,645,820 | B1 | 11/2003 | Peng et al. |
| 6,674,123 | B2 | 1/2004 | Kim |
| 6,690,039 | B1 | 2/2004 | Nemati et al. |
| 6,693,333 | B1 | 2/2004 | Yu |
| 6,707,708 | B1 | 3/2004 | Alvandpour et al. |
| 6,711,063 | B1 | 3/2004 | Dejenfelt et al. |
| 6,711,088 | B2 | 3/2004 | Hayashi et al. |
| 6,787,850 | B1 | 9/2004 | Pelloie |
| 6,891,389 | B1 | 5/2005 | Walker et al. |
| 6,894,324 | B2 | 5/2005 | Ker et al. |
| 6,898,116 | B2 | 5/2005 | Peng |
| 6,940,317 | B2 | 9/2005 | Suga |
| 6,958,519 | B2 | 10/2005 | Gonzalez et al. |
| 6,969,888 | B2 | 11/2005 | Williams et al. |
| 6,985,026 | B2 * | 1/2006 | Toyoyama .................. 327/540 |
| 7,064,942 | B2 | 6/2006 | Ker et al. |
| 7,132,711 | B2 | 11/2006 | Forbes et al. |
| 7,253,485 | B2 | 8/2007 | Shibahara |
| 2001/0054886 | A1 * | 12/2001 | Takahashi et al. ........... 323/282 |
| 2002/0031028 | A1 | 3/2002 | Forbes et al. |
| 2002/0096723 | A1 * | 7/2002 | Awaka ....................... 257/360 |
| 2002/0153957 | A1 * | 10/2002 | Jordanov ................... 330/308 |
| 2002/0154462 | A1 | 10/2002 | Ker et al. |
| 2002/0185681 | A1 * | 12/2002 | Nakano et al. .............. 257/336 |
| 2002/0195623 | A1 | 12/2002 | Horiuchi |
| 2003/0089951 | A1 | 5/2003 | Ker et al. |
| 2003/0178648 | A1 | 9/2003 | Bonsal |
| 2004/0004298 | A1 | 1/2004 | Madurawe |
| 2004/0022109 | A1 | 2/2004 | Yoon et al. |
| 2004/0077151 | A1 | 4/2004 | Bhattacharyya |
| 2004/0252546 | A1 | 12/2004 | Liaw |
| 2005/0035410 | A1 | 2/2005 | Yeo et al. |
| 2007/0114582 | A1 | 5/2007 | Shiu et al. |

FOREIGN PATENT DOCUMENTS

| | | |
|---|---|---|
| TW | 479852 | 3/2002 |
| TW | 480773 | 3/2002 |
| TW | 495106 | 7/2002 |

OTHER PUBLICATIONS

Takamiya, M. and Hiramoto, T.: "High Performance Electrically Induced Body Dynamic Threshold SOI MOSFET (EIB-DTMOS) with Large Body Effect and Low Threshold Voltage" IEDM Technical Digest 1998.

Diaz, C.H. et al.; "Device Properties in 90nm and beyond and implications on Circuit Design", IEEE 2003.

Rabaey, J. "Issues in Low Power Design—Managing Leakage", Dept of Electrical Engineering and Computer Sciences, Univ. of CA—Berkeley, Aug. 23, 2004.

Bohr, M. High Performance Logic Technology and Reliability Challenges. 2003 IPRS. Apr. 1, 2003.

Fallah, et al. Standby and Active Leakage Current Control and Minimization in CMOS VLSI Circuits. IEICE Trans. on Electronics. Special Section on Low-Power LSO and Low Power IP. vol. E88-C. No. 4. Apr. 2004.

Cao, et al. Reducing Dynamic Power and Leakage Power for Embedded Systems. ASIC-SOC Conference, 2002. 15th Annual IEEE International vol. Uss. Sep. 2002.

Min, et al. Zigzag Super Cut-Off CMOS (ZSCCMOS) Block Activation with Self-Adaptive Voltage Level Controller: An Alternative to Clock-Gating Scheme in Leakage Dominant Fra Solid-State Circuits Conference 2003 Digest of Technical Papers ISSCC 2003.

Henzler, et al. Fast Power-Efficient Circuit-Block Switch-Off Scheme. Electronics Letters, vol. 40. Iss 2. Jan. 22, 2004.

Narendra, et al. Full Chip Subthreshold Leakage Power Prediction and Reduction Techniques for sub-0.18um CMOS. Solid-State circuits. IEEE Journal of vol. 39. Iss.3. Mar. 2004.

Kao, et al. Dual-Threshold Voltage Techniques for Low-Power Digital Circuits. Solid-State Circuits. IEEE Journal. vol. 35. ISs. 7. Jul. 2000.

Kuroda, et al. A 0.9-V, 150MHz, 10-mW, 4mm2, 2-D Discrete Cosine Transform Core Processor with Variable Threshold-Voltage (VT) Scheme. Solid-State Circuits. IEEE Journal vol. 31 Iss 11 Nov. 1996.

Tschanz, et al. Adaptive Body Bias for Reducing Impacts of Die-to-Die and within-die Parameter Variations on Microprocessor Frequency and Leakage. Solid State Circuits Conference 2002 Digest of Technical Papers ISSCC 2002 IEEE International vol. 1.

von Amim, et al. Efficiency of Body Biasing in 90-nm CMOS for Low-Power Digital Circuits. Solid State Circuits. IEEE Journal. vol. 40. Iss. 7. Jul. 2005.

Borkar, S. Circuit Techniques for Subthreshold Leakage Avoidance, Control, and Tolerance. IEEE. 2004.

* cited by examiner

APPARATUS AND METHOD FOR IMPROVING DRIVE-STRENGTH AND LEAKAGE OF DEEP SUBMICRON MOS TRANSISTORS

CROSS REFERENCE TO RELATED APPLICATIONS

This application is a continuation-in-part of U.S. patent application Ser. No. 11/029,542, filed Jan. 4, 2005 U.S. Pat. No. 7,224,205, the entirety of which is incorporated herein by this reference thereto. The application further claims priority from U.S. provisional patent application Ser. Nos. 60/717,769, filed Sep. 19, 2005, and 60/601,979 filed Aug. 17, 2004, and 60/585,582 filed Jul. 7, 2004.

BACKGROUND OF THE INVENTION

1. Technical Field

The invention relates to MOS transistors. More specifically, the invention relates to the improvement of drive-strength and leakage of deep submicron MOS transistors.

2. Discussion of the Prior Art

Users of conventional complementary metal-oxide semiconductor (CMOS) technology currently face some difficult choices as the minimum feature size of such devices shrinks to below 100 nanometers and power supply voltage is reduced to less than 1.0V. A typical layout of a 0.18 micron transistor 100 is shown in FIG. 1. The transistor is manufactured over a well 110 where a diffusion area 120 is created. The gate 130 of the transistor 100 is formed over a well 120, and has a width w, for example, of 0.18 micron as a minimum width for a transistor that is fabricated using 0.18 micron technology. Contacts 140 and 141 comprise one terminal of the NMOS transistor, for example the drain, and the contact 150 provides another terminal of the transistor 100, for example the source. A contact 131 is connected to the gate 130. There are other minimal feature sizes, such as a minimal size for the well x and a minimum distance from the edge of the well to the diffusion area 120 marked as y. Dimensions, such as w, x and y are generally process dependent. Power supply voltage is reduced in correspondence with the minimum feature size to maintain a limit on the electrical field across the oxide, which is made thinner as feature size is decreased. Therefore, power supply voltage is decreased from 3.3V for 0.35-micron CMOS technology to 1.8V for 0.18 micron technology, and is further expected to be at the 1.0V level for 100 nanometers CMOS technology.

While power supply voltage is decreased, the threshold voltage of NMOS transistors has stayed between 0.45V and 0.35V. The relationship between the NMOS threshold voltage $V_{th}$ and CMOS power supply $V_{DD}$ is known to be very critical. The threshold voltage determines the leakage current $I_{off}$ of the transistor when it is in its OFF state. As the threshold voltage is driven lower, the leakage current increases.

The drain current of the transistor is a direct function of the overdrive of the transistors, measured as the difference between power supply $V_{DD}$ and threshold voltage $V_{th}$. The drain current of the transistor determines the time required to charge the load capacitance from ground to the level of power supply $V_{DD}$, or vice versa. This overdrive voltage has decreased constantly as the power supply decreased from 3.3V to 1.0V, while threshold voltage decreased only from 0.45V to 0.35V. For 0.1 micron technology, the threshold voltage of the transistors is scaled below 0.35V at the expense of a very high OFF stage leakage current $I_{OFF}$, which ranges between 1 nA to 100 nA for a transistor having a width of 1 miron. For a transistor with gate width of 10 microns, the OFF current increases to ten times the value stated above, i.e. from 10 nA to 1000 nA. For CMOS technology having a 0.1-micron minimum feature size, a typical VLSI chip is expected to contain over 100 million gates. Given a leakage of every gate of 1 microamperes, this results in a whopping 100 amperes of leakage current.

A scheme for dynamically controlling the transistor threshold voltage has been proposed by Takamiya et al. in *High Performance Electrically Induced Body Dynamic Threshold SOI MOSFET (EIB-DTMOS) with Large Body Effect and Low Threshold Voltage* IEDM Technical Digest 1998. Takimiya et al. suggest a scheme that shorts the gate and the substrate of the transistors, thereby causing the substrate voltage of the transistor to increase as the gate voltage is increased for an n-channel MOS (NMOS) transistor. This scheme is proposed for NMOS transistors fabricated on silicon-on-insulator (SOI) substrates, where the transistor substrate is totally isolated. This scheme manipulates the threshold voltage by changing the bias of the substrate or well in the positive direction for a NMOS transistor, along with a positive signal at the gate. As the substrate or well-to-source voltage becomes positive, the depletion layer width is reduced resulting in lower threshold voltage for the transistor, thereby increasing the current from the transistor. In the native form, Takimiya et al. is applicable only for circuits using a power supply voltage of less than 0.6V because this scheme turns on the substrate-to-source diode and the leakage from this diode must be limited or one would trade one type of leakage for another, i.e. from drain-to-source leakage to substrate-to-source leakage. Another approach is discussed in U.S. Pat. No. 6,521,948 by Ebina trying to solve is the accumulation of holes, created by impact ionization, in the floating body region of a semiconductor-on-insulator (SOI) transistor. The accumulated holes cause a relatively uncontrolled decrease in threshold voltage. Therefore, Ebina places the body into a slight, presumably controlled, forward bias conditions with respect to the source by connecting a reverse biased diode. Specifically, Ebina concentrates on controlling the current in the ON state, in particular to avoid its variable and uncontrolled increase. The use of a backward biased diode is deficient in several ways. Firstly, the reverse current through the diode varies over orders of magnitude and is highly sensitive to temperature. Secondly, the expanded polysilicon gate region creates a depletion region in the SOI substrate, and more explicitly in fully depleted SOI, which effectively cuts off the end of the gate from the source or the drain region during the ON state of the transistor. Secondly, while Ebina deals effectively with voltage ranges of 2 volts and above, it fails to provide a solution for transistor operating in lower voltages as common in modern designs.

Douseki in U.S. Pat, No. 5,821,769 describes a method for the control of the threshold voltage of an MOS transistor by connecting a MOS transistor between the gate and the substrate to control the threshold voltage. Douseki requires the addition of another transistor for every transistor whose threshold voltage is dynamically controlled. The adjusted threshold voltage is fixed by the power supply voltage and the threshold voltage of the additional transistor. The area penalty is fairly large for this approach and it requires additional process steps.

There is a therefore a need in the art for a technology which can reduce the leakage of MOS transistors without adversely affecting the drive current or the drain current under saturation conditions, which are defined as drain-source voltage and gate-source voltage equal to the power supply voltage ($V_{DS}=V_{GS}=V_{DD}$). It would be further advantageous if the solution addressed low voltage operation in the range of 2V and below.

SUMMARY OF THE INVENTION

An apparatus and method of manufacture for metal-oxide semiconductor (MOS) transistors is disclosed. Devices in accordance with the invention are operable at voltages below 2V. The devices are area efficient, have improved drive strength, and have reduced leakage current. The inventive devices use a dynamic threshold voltage control scheme that is implemented without changing the existing MOS technology process. This scheme controls the threshold voltage of each transistor. In the OFF state, the magnitude of the threshold voltage of the transistor is increase, keeping the transistor leakage to a minimum. In the ON state, the magnitude of the threshold voltage is decreased, resulting in increased drive strength. The invention is particularly useful in MOS technology for both bulk and silicon on insulator (SOI) CMOS. The use of reverse biasing of the well, in conjunction with the above construct to further decrease leakage in a MOS transistor, is also shown.

DETAILED DESCRIPTION OF THE INVENTION

The invention comprises the addition of a circuit to a MOS transistor, for example an NMOS transistor, that results in an increase in drive current while the transistor is in an ON state, and a reduction in leakage current while the transistor is in the OFF state. Specifically, this is achieved by implementing a control circuit between the gate and the substrate or well of the transistor. The control circuit may be comprised of linear and/or non-linear passive components and can be as simple as a resistor, a capacitor, or include one or more diodes, in a plurality of combinations suitable for leakage current reduction. Specifically, the circuit forces a high threshold voltage $V_{TH}$ in the OFF state of the NMOS transistor and a low $V_{TH}$ in the ON state of the NMOS transistor. A person skilled in the art would note that such a control circuit would work equally well with a PMOS type transistor. A detailed description of the disclosed invention follows.

Figure 1:
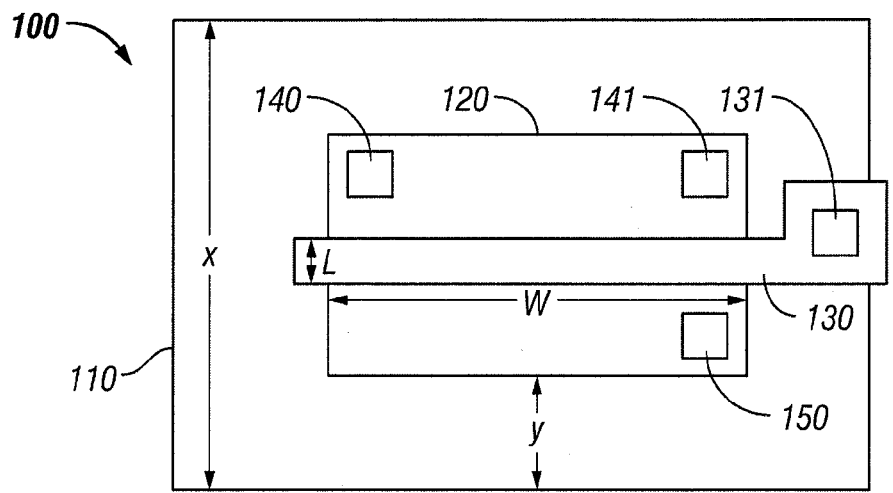
FIG. 1 is schematic diagram showing a typical layout of a 0.18 micron transistor (prior art)
Figure 2:
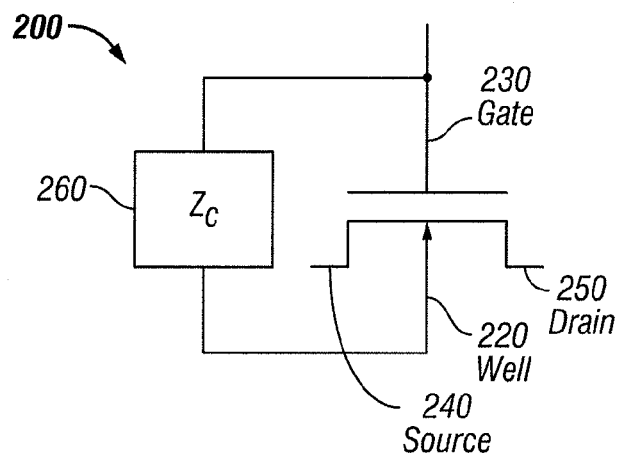
FIG. 2 is a schematic diagram of a control circuit $Z_C$ connected between the gate and substrate terminals of a NMOS transistor in accordance with the disclosed invention.

FIG. 2 is a schematic diagram of a circuit 200 in accordance with the disclosed invention. A control circuit $Z_C$ 260 is connected between a gate 230 and a substrate 220 of an NMOS transistor comprising a substrate or well 220, a gate 230, a drain 240, and a source 250. In accordance with the invention, the control circuit $Z_C$ implements a dynamic voltage control by using, for example, various types of active elements, passive elements, or any combinations thereof, to control substrate or well voltage. By controlling the threshold voltages such that they are different in the ON and OFF states of the controlled NMOS transistor, improvement in drive current in the ON state and leakage current in the OFF state is achieved. Furthermore, an extremely area-efficient implementation of dynamic threshold voltage control is provided, as described in further detail below.

Figure 3:
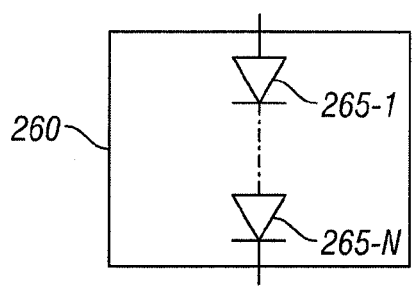
FIG. 3 is a schematic diagram of an exemplary implementation of control circuit $Z_C$.

FIG. 3 is a diagram showing an exemplary control circuit 260 comprised of a plurality of diodes 265. The control circuit 260 may comprise of one or more forward biased diodes, resistors, and capacitors connected between the gate 230 and the substrate 220 of the NMOS transistor. The dynamically adjusted threshold voltage is varied by adjusting the diode layout geometry, such as the separation between the N+ and P+ implants, and doping of N+ and P+ regions of the poly diodes. No significant variations in the standard manufacturing process are required.

Figure 4A:
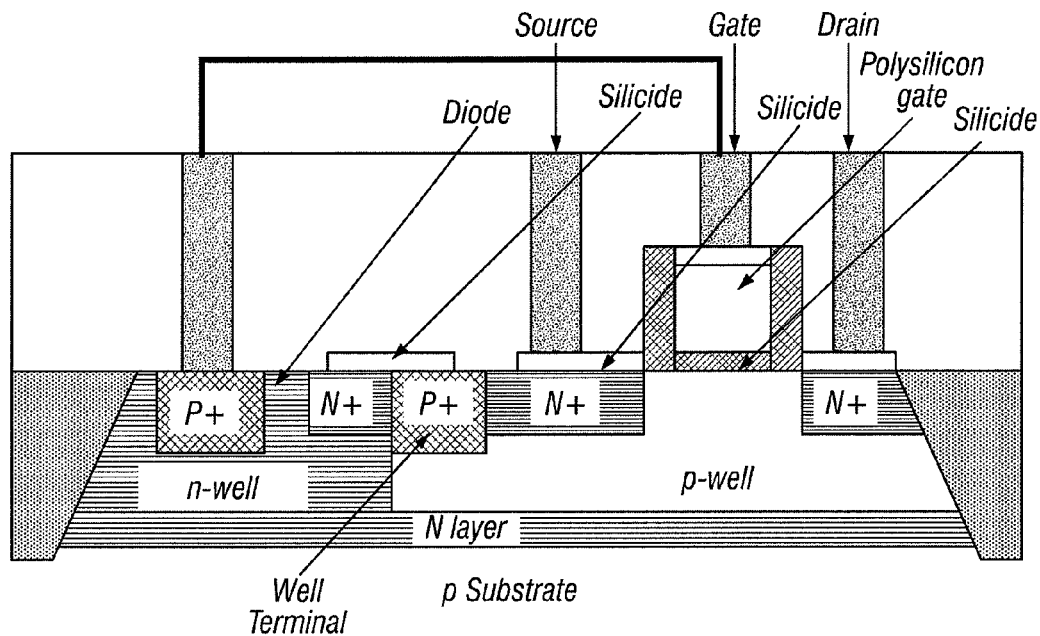
FIG. 4A is a cross-section diagram of an NMOS transistor having a diffused diode control circuit $Z_C$.
Figure 4B:
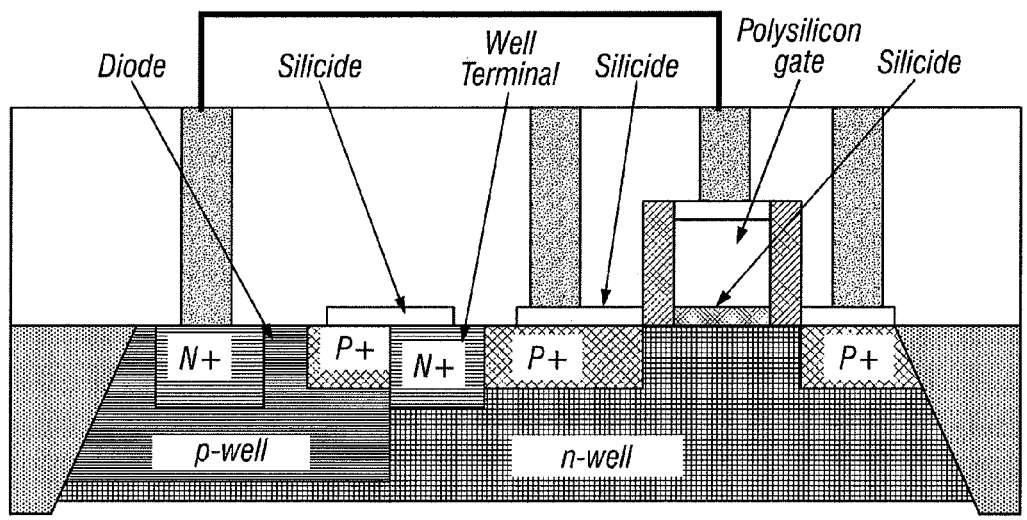
FIG. 4B is a cross-section diagram of a PMOS transistor having a diffused diode control circuit $Z_C$.

The diodes are fabricated by a variety of techniques, as detailed below. One such type of diode is a diffused diode. These diodes are conventional diodes that are fabricated by diffusing n-type and p-type layers in a completed isolated structure. The voltage across the diodes is controlled by adjusting the doping profiles in silicon and programming the area, thereby controlling the voltage drop across the diode. FIGS. 4A and 4B show cross sections of a circuit 200, of FIG. 2, using such diffused diodes. The diffused diodes are conventional diodes used for adjusting the bias voltage at the well.

The diodes are formed differently for NMOS and PMOS transistors. The NMOS transistors are formed in a region isolated from the p-type substrate or well by a single or multiple deep N type implant. This isolation is achieved by existing triple well CMOS technology, a term known to those skilled in the art. This isolation can, for example, be achieved by a deep N type implant in the region of NMOS transistors consisting of phosphorous with an implant dose ranging from $1 \times 10^{11}/cm^2$, to $1 \times 10^{14}/cm^2$ and an energy ranging from 250

KeV to 2 MeV. This implant is annealed at temperatures ranging from 900° C. to 1150° C. for 15 seconds to 2 hours.

Diodes for use with NMOS are formed in an area adjoining the NMOS, next to the well tap in the same isolation area. This area containing the diode also receives the n-well implant, which is used to form the n-well region for PMOS transistors. This is done by using, for example, phosphorous or arsenic ions with doping in the range of $1E11/cm^2$ and $5E14/cm^2$ at an implant energy in the range of 25 KeV and 400 KeV. The N type isolation implant and the N-well implant form a contiguous N type semiconductor region. An n+ contact region is formed in the implanted n-well region to provide the ohmic contact for the cathode. The anode region is formed by the p+ implant that is used for making the p+ source/drain regions for the PMOS transistor. The anode and cathode regions are formed using the source and drain implants for PMOS and NMOS, respectively. The implant dose and energy are determined by the electrical characteristics of the transistor. A silicide strap formed by in situ self-aligned silicidation of silicon by reacting it with titanium, cobalt, nickel, or any other suitable metal is formed to short the cathode of the diode with the well contact of the NMOS. In an embodiment of the disclosed invention a metallic conductor is required, typically a metal 1 copper layer.

In a PMOS implementation shown in FIG. 4B, the transistor itself is isolated by virtue of being formed in the N-well, and no additional steps are needed to form the isolation region for the transistor and the diode. The anode region of the diode is formed by the anti-punch through boron implant used for NMOS transistors or another suitable implant step. To insure a contiguous P type region for the diode in the N-well, an additional p-type implant using boron or indium with dose in the range of 1E12 to $1E15/cm^2$ and implant energy in the range of 5 KeV to 200 KeV may be used to form the anode region of this diode. The ohmic contact to the anode region is formed by the source/drain implant for the PMOS transistor. The cathode region of the diode is formed by the n+ implant, which is the same implant as the source/drain implant for the NMOS transistor. A silicide strap formed by in situ self aligned silicidation of silicon by reacting it with titanium, cobalt, nickel, or any other suitable metal is formed to short the anode of the diode with the well contact of the PMOS. In an embodiment of the disclosed invention a metallic conductor is required, typically a metal 1 copper layer.

Another type of diode that may be used in practicing this invention is an integrated diode. These diodes are formed by the contact of n-type and p-type polysilicon to underlying silicon of opposite polarity. The polysilicon layers are the same as those that are used to build the gate of MOS transistors. These diodes are formed by preventing the formation of the gate oxide underneath the transistor gates, or by removing the oxide prior to the deposition of polysilicon. The voltage across the diodes is adjusted by controlling the doping profiles in silicon and programming the area of the diodes.

Figure 4C:
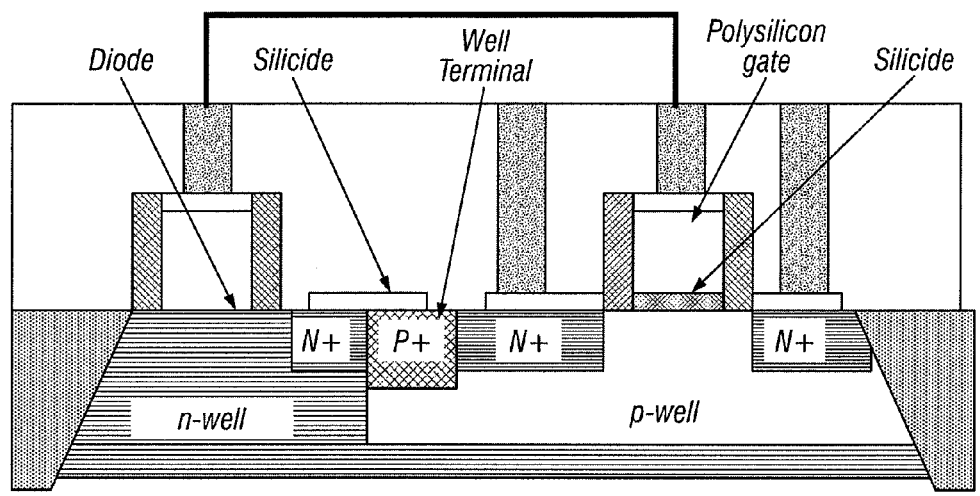
FIG. 4C is a cross-section diagram of an NMOS transistor having a self-aligned diode control circuit $Z_C$.

FIG. 4C is shows a cross section of a circuit 200, of FIG. 2, that uses a self aligned diode control circuit $Z_C$. The diodes are formed by depositing polysilicon on top of the regions where gate oxide has been prevented from growing during the thermal oxidation cycle, or from which it has been removed prior to the deposition of polysilicon by appropriate process step. The wafers are processed through the typical CMOS process by implanting well regions and forming the isolation oxide by any of the established processes. Additional process steps that form the isolation region where NMOS transistors are to be formed are carried out as described in the previous paragraph. Next, the threshold implants are made. The growth of silicon dioxide on selected areas is accomplished by selectively implanting the area of silicon where the oxide is to be prevented from growth with a photoresist mask covering the rest of the wafer. This is achieved, for example, by implanting this region with nitrogen atoms by ion implantation to a dose of $1E14/cm^2$ to $1E16/cm^2$ at an implant energy of 2 KeV to 50 KeV. The wafers are then taken through the gate oxidation cycle, as may be required by the process, to achieve the appropriate electrical characteristics of the transistor. Thus, oxidation of the implanted regions is prevented while the oxidation of silicon region on the remaining wafer takes place.

A layer of polysilicon is next deposited on the wafer, and the regular CMOS process steps are conducted. The polysilicon layer is doped to form a conductivity region n+ and p+ for NMOS and PMOS transistor gates, respectively. The ohmic electrical connection between the diode terminal and the well terminal is accomplished with the help of the self-aligned silicide, which is an essential part of the CMOS process step. In an alternate embodiment of the invention, the gate oxide underneath the polysilicon on top of the diode region is damaged by the appropriate dopant type to change the electrical characteristic of the oxide, to allow it to conduct electrical charge. For NMOS transistor, a phosphorous or arsenic implant, and for PMOS transistor, a boron implant, of dose $1\times10^{13}$ to $1\times10^{16}$ atoms/$cm^2$ with an energy ranging from 25 KeV to 200 KeV is used to implant the polysilicon layer and damage the underlying gate oxide in the region of the diode and form an electrically conducting electrode.

Figure 4D:
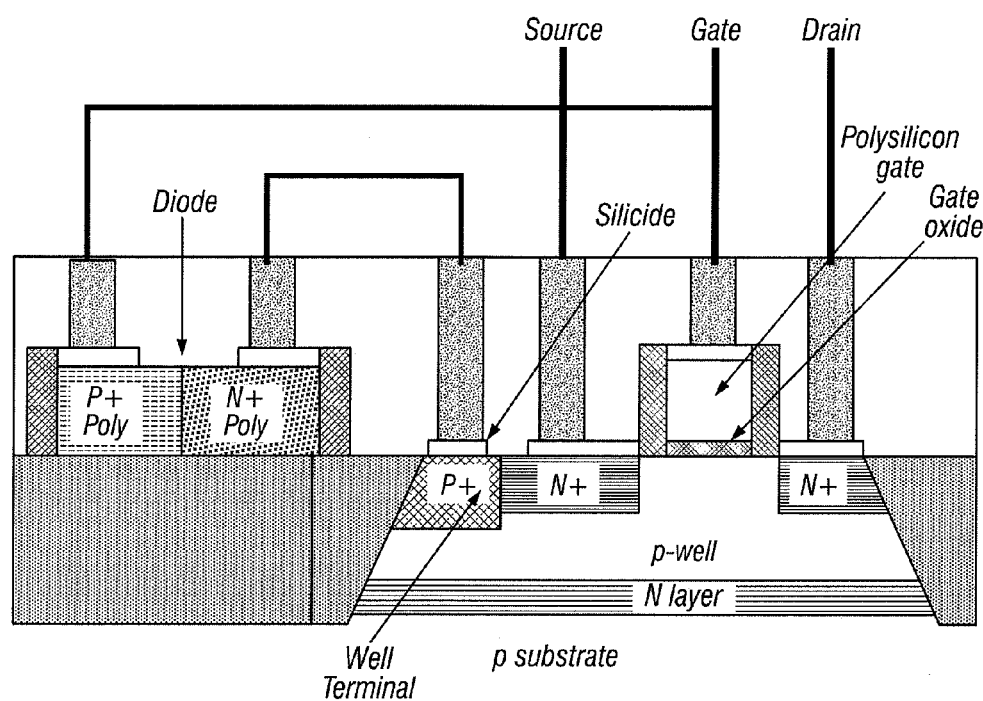
FIG. 4D is a cross-section diagram of an NMOS transistor having a poly diode control circuit $Z_C$.

Yet another type of diode that may be used in the invention is the in-line polysilicon diode. These are presently considered to be the most area and process efficient structures and are created by implanting n-type and p-type dopant separated laterally in a line of polysilicon. The voltage drop across the diodes is controlled by programming the location of the n-type and p-type implants used to form the diodes. FIG. 4D shows a cross section of a circuit 200, of FIG. 2, having a poly diode control circuit $Z_C$. In one embodiment of the invention, a lateral diode is formed in a line of polysilicon between n+ and p+ polysilicon regions, where the electrical characteristics of the polysilicon diode are controlled by the lateral isolation between the n+ and p+ regions in polysilicon. The p+ and the n+ regions of polysilicon are formed by the source/drain implants of the NMOS and PMOS transistors. The polysilicon is doped, for example, with phosphorous, arsenic or antimony to a dose in the range of $5\times10^{14}$ to $5\times10^{16}/cm^2$ at an energy in the range of 5 KeV to 200 KeV. The p+ region is formed by doping polysilicon to a dose in the range of $1\times10^{14}$ to $5\times10^{16}/cm^2$ at an energy in the range of 5 KeV to 200 KeV with boron or indium. The thickness of the polysilicon layer is determined by the transistor electrical characteristics. For CMOS technology with 0.13 micron to 0.07 micron minimum drawn dimensions, the thickness of the polysilicon layer is in the range of 1000 angstroms to 4000 angstroms.

The layer of polysilicon is implanted with n+ and p+ on two sides having a lateral separation. A diode is formed at the intersection of the two regions. The forward characteristics of this diode are dependent upon the level of doping of the two impurity types in polysilicon and the separation between the two regions. Coincident mask layers (Is=0) or overlapping mask layers (negative Is) produce diodes having very high reverse leakage and low forward drop. On the other hand, with increasing separation of the n+ and p+ regions, the reverse leakage of the diode decreases and the forward drop across the diode decreases. The space between the n+ and p+ implant regions in polysilicon is, for example, between −0.5 micron (overlap) to +2.0 micron (separation) and it is programmed during mask layout. The lateral-masking dimension controls the barrier height of polysilicon diode. Alternately, a polysilicon layer is uniformly implanted in the region of the diode by an N-type P-type dopant, as the case may be, with a lower implant dose, such as $1\times10^{13}$-$5\times10^{15}$ atoms/cm² of appropriate doping species, and the desired region for the formation of anode (cathode) is implanted with a heavier dose of the P (N) type species, e.g. with a dose of $2\times10^{13}$/cm²-$5\times10^{16}$ atoms/cm². This arrangement does not require alignment of the N and P type implants and relies strictly on the dopant concentration to determine the diode characteristics.

The isolation of the NMOS transistor obtained by this technique leaves the N type layer underneath the NMOS transistor floating, i.e. not in ohmic contact with any node with a well-defined voltage. The most appropriate application of this invention is for systems using $V_{DD}$ at or below 1.0V, where the possibility of any parasitic action due to incidental forward biasing of any p-n junction is negligible.

In yet another embodiment of the invention use is made of Schottky diodes. The Schottky diodes are formed at the interface of a layer of a metallic material, for example titanium, titanium nitride, or relevant silicides, and n-type or p-type silicon. The Schottky diodes can be formed on n-type and p-type silicon by carefully selecting the work function of the metallic layer and adjusting the Fermi level of the silicon by control of doping. The voltage across the diodes can be adjusted by changing the doping in the well and the diode area.

Figure 4E:
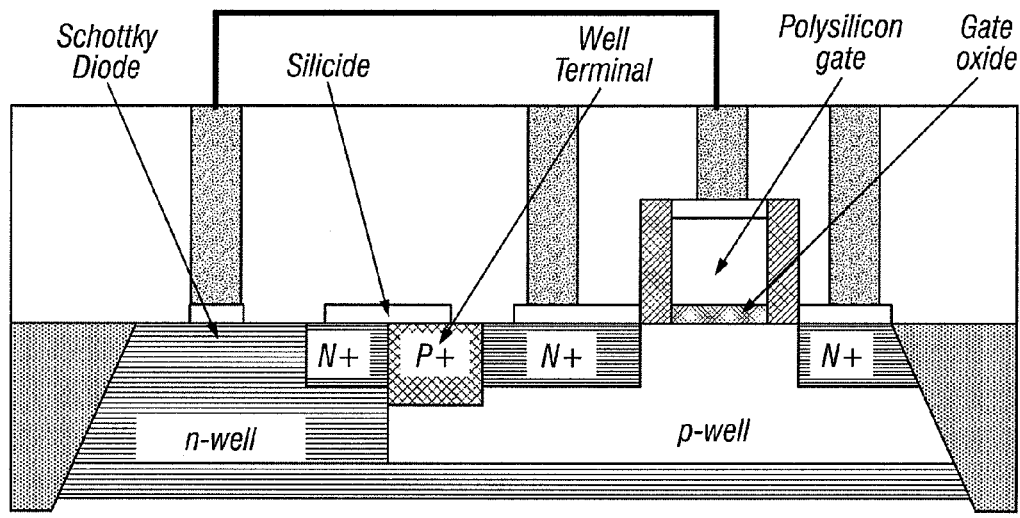
FIG. 4E is a cross-section diagram of an NMOS transistor having a Schottky diode control circuit $Z_C$.

FIG. 4E shows a cross section of a circuit 200, of FIG. 2, having a Schottky diode control circuit $Z_C$. Taking advantage of the suitable band gap of, for example, TiN as the contact metal, Schottky diodes can be formed on both the n-type and p-type silicon with light doping (less than 1E 17/cm³). Thus, a Schottky diode for NMOS is formed by making, for example, a TiN to n-type diode in the n-well region. A Schottky diode for PMOS is formed in the p-well region adjoining the PMOS transistor.

In one embodiment of the invention, the well biasing scheme is used only for PMOS transistors that are built in a CMOS technology. The PMOS transistors are isolated as they are formed in the n-well regions, while NMOS transistors are formed in the p-well regions that are electrically connected to one another because they are formed over p-type silicon substrate as the starting substrate material.

To control the substrate voltage, one or more diode types can be used in a design by connecting them in series or parallel to obtain the appropriate voltage at the substrate, with appropriate temperature coefficient. Also, the threshold voltage control can be applied to either or NMOS or PMOS transistor, or to both transistors with appropriate diode types. The invention covers the three cases, namely dynamic control of threshold voltage for NMOS only, for PMOS only, and that of both NMOS and PMOS.

For the purpose of explanation, it is now assumed that the operating voltage VDD is 1.0V for a CMOS circuit. A CMOS buffer uses an NMOS transistor having a source-substrate diode area of Asn and current-voltage characteristics that are as follows:

$$V_f = n_{n0} * V_t * \ln(I_{diode}/I_{sn0}) \quad (1)$$

where $n_{n0}$ is the ideality factor that may vary, depending on the specific implementation of the diodes, between a value close to one for source/substrate diodes, 1.1-1.2 for Schottky diodes, and close to 2 for certain ploy diodes;

$V_t$ is the thermal voltage that equals kY/e, where k is Boltzman's constant, e is the charge of an electron and T is the absolute temperature;

$I_{diode}$ is the current passing through the well-substrate diode; and $I_{sn0}$ is the well-substrate diode saturation current.

An external diode $D_{ex}$ is used as a control device $Z_C$ 260, of FIG. 2. The voltage across the external diode is given by $$V_{f\_ex} = n_{n0} * V_t * \ln(I_{diode}/I_{ex0}) \quad (2)$$

where $I_{ex0}$ is the diode saturation current of the external diode. Because the two diodes are in series, the same current flows through the diodes. The sum of the voltages across the two devices is equal to $V_{DD}$.

$$V_{DD} = V_f + V_{f\_ex} = n_{n0} * V_t * \ln(I_{diode}/I_{sn0}) + n_{n0} * V_t * \ln(I_{diode}/I_{ex0}) \quad (3)$$

Because $I_{sno}$ is fixed by the NMOS transistor characteristics, the voltage across the external diode is varied by changing diode saturation current $I_{ex0}$ which is a product of the current density and the area. If the voltage drop across the two diodes is exactly equal, then the substrate voltage of the NMOS transistor is at 0.5V when the gate is at 1.0V. Reducing $I_{ex0}$ results in decreased voltage drop $V_f$ across the source-substrate diode and, hence, the threshold voltage of the NMOS transistor.

Figure 5:
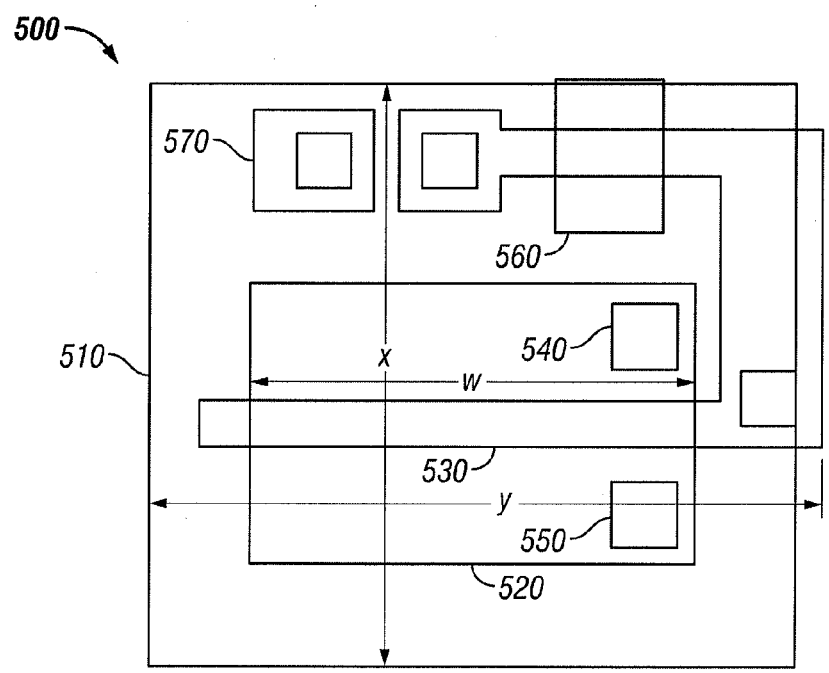
FIG. 5 is a diagram showing an exemplary layout of a MOS transistor having a control circuit $Z_C$.

FIG. 5 shows a layout 500 of a a MOS transistor having a control circuit $Z_C$. The MOS transistor is formed over a substrate 510 and a well 520, for example an n-well, over which a gate 530 is deposited having an insulating layer in-between a well 520 and a gate 530. Contacts 540 and 550 are connected, for example, to the drain and source of the MOS transistor, and a contact 535 to a gate 530. Furthermore, a diode 560 is formed which may be connected to the substrate 570 by a metal path.

In an exemplary embodiment of the invention, for a power supply voltage of 1.0V, the control circuit 260 comprises a single bulk-silicon diode capable of sustaining a forward drop of between 0.5V to 0.7V when connected in series with the substrate-to-source diode. The resulting voltage drop across the substrate-to-source diode is 0.5 to 0.3V. In one embodiment of the invention, the control circuit 260 is formed from a diffused diode. In another embodiment of the invention, the control circuit is formed from a single polysilicon diode or two polysilicon diodes connected in series. For a power supply voltage of 0.9V, the bias control circuit 260 should provide a forward drop of in the range of 0.5-0.3V across the substrate-to-source diode.

In the exemplary case of a power supply of 1.5V, the NMOS and PMOS transistors are designed typically with a threshold voltage of 0.45V, with an upper limit of 0.7V and a lower limit of 0.3V. These numbers refer to the magnitude of the voltage only because the threshold voltage of the PMOS devices is a negative quantity. The configuration of the control circuit $Z_C$ 260 depends upon the operating voltage. For a power supply voltage of 1.5V, the configuration of this control circuit $Z_C$ 260 is accomplished by using two or three diodes in series. The two diodes are made in polysilicon by doping the polysilicon with an n+ and p+ implant and the using silicide to connect the gate of the NMOS transistor to the anode, or for a PMOS transistor to the cathode of the first diode. Similarly, the cathode of the first diode is connected to the anode of the second diode with silicide. Because silicide is formed on the polysilicon layer in a self-aligned manner, it does not require any contact hole or metal to be formed on the transistor. The diodes can also be formed on silicon substrate.

Furthermore, a combination of diodes formed on polysilicon and silicon substrates can be used. In an implementation of invention in SOI technology, the diode is formed on isolated islands insulated by oxide or by a set of polysilicon diodes, as described above.

Figure 6:
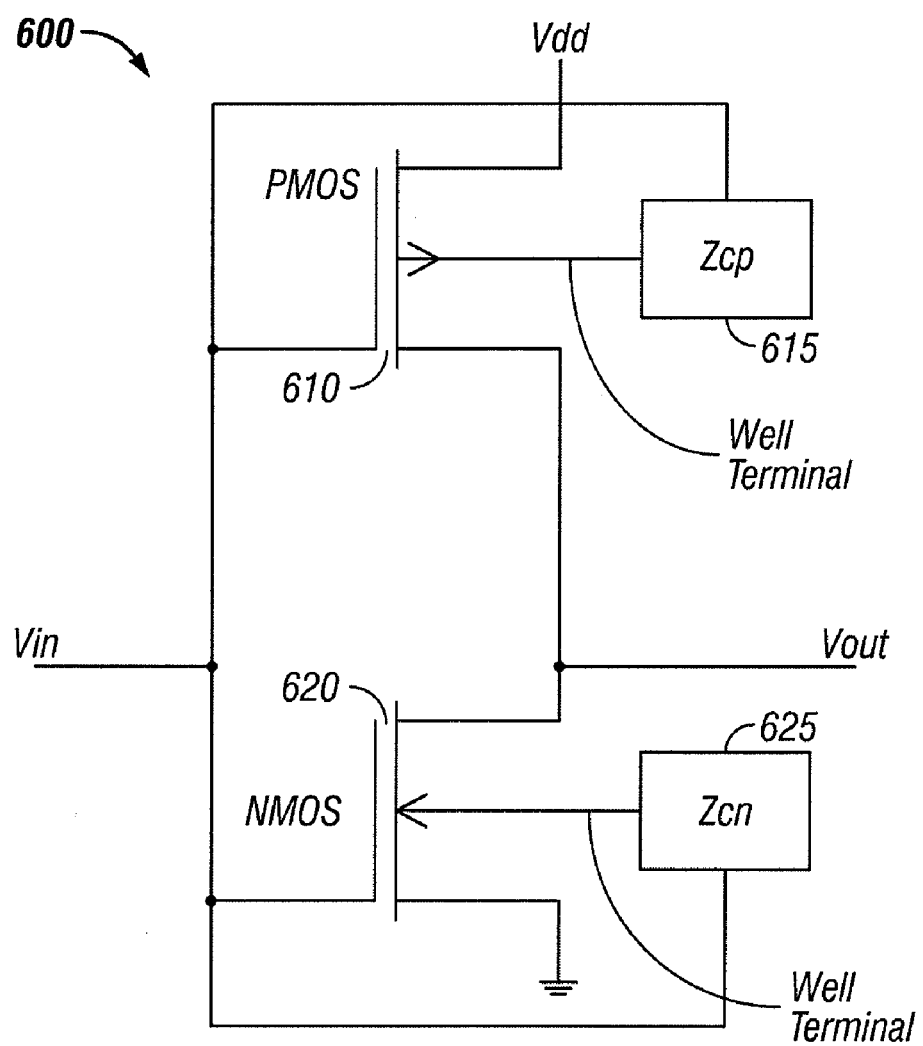
FIG. 6 is a diagram showing an exemplary implementation of the invention in a CMOS buffer.

FIG. 6 is a schematic diagram 600 of a CMOS buffer according to the invention. The control circuits $Z_{C_n}$ 625 and $Z_{C_p}$ 615 are the non-linear devices for controlling the threshold voltage of NMOS transistor 620 and PMOS transistor 610 respectively. Control circuits 615 and 625 are implemented in accordance with the principles of the invention and include at least a forward biased diode and a capacitor in parallel, as further explained below.

Figure 7:
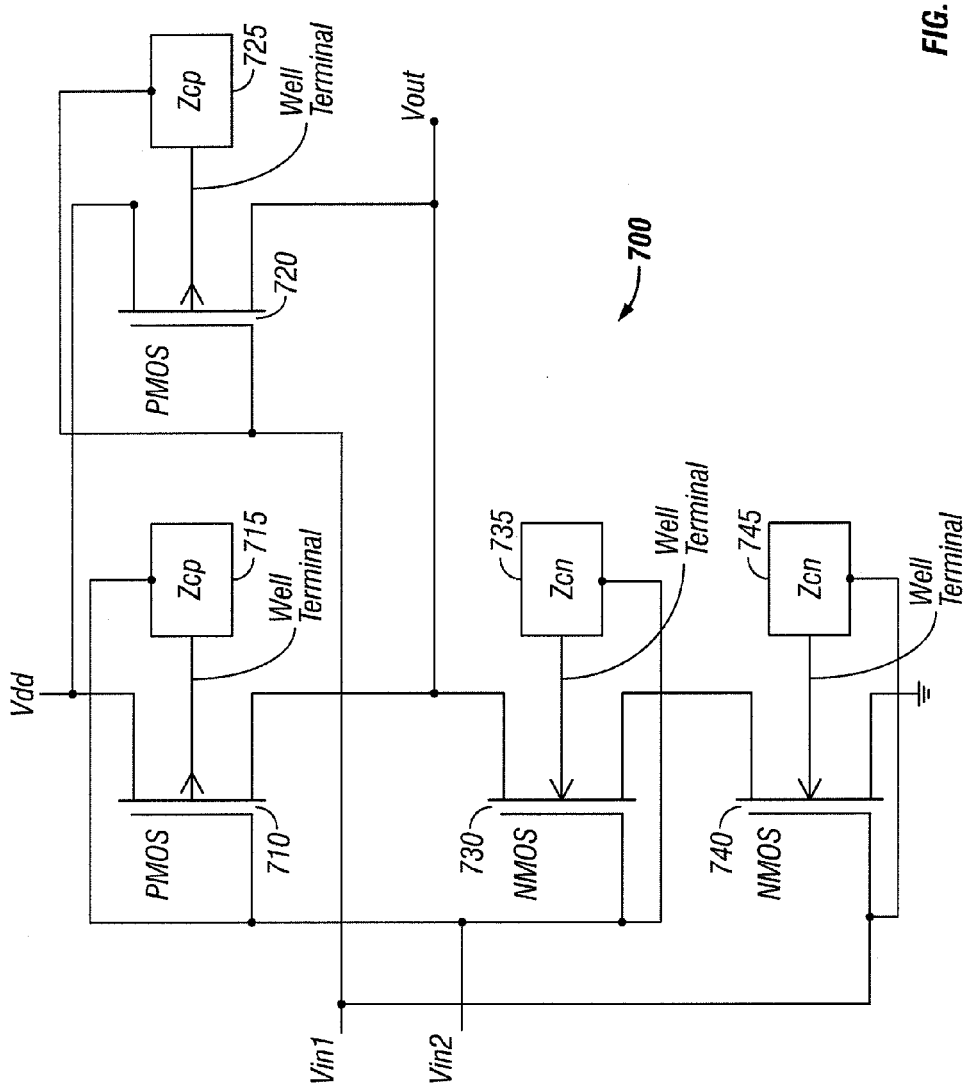
FIG. 7 is a diagram showing an exemplary implementation of the invention in a CMOS NAND gate.

FIG. 7 is a schematic diagram 700 of a CMOS NAND gate according to invention. The two inputs to the NAND gate are $V_{in1}$ and $V_{in2}$, and $V_{out}$ shows the output of the circuit 700. The circuits using these non-linear devices for controlling the threshold voltages of the NMOS transistors 730 and 740 are the control circuits $Z_{C_n}$ 735 and $Z_{C_n}$ 745, respectively. The circuits for controlling the threshold voltages of the PMOS transistors 710 and 720 are the control circuits $Z_{C_p}$ 715 and $Z_{C_p}$ 725, respectively. The control circuits 715, 725, 735, and 745 may be customized for different transistors, as may be required by specific circuit configurations. The control circuits 715, 725, 735 and 745 are implemented in accordance with the invention and include at least a forward biased diode and a capacitor in parallel, as further explained below.

Figure 8:
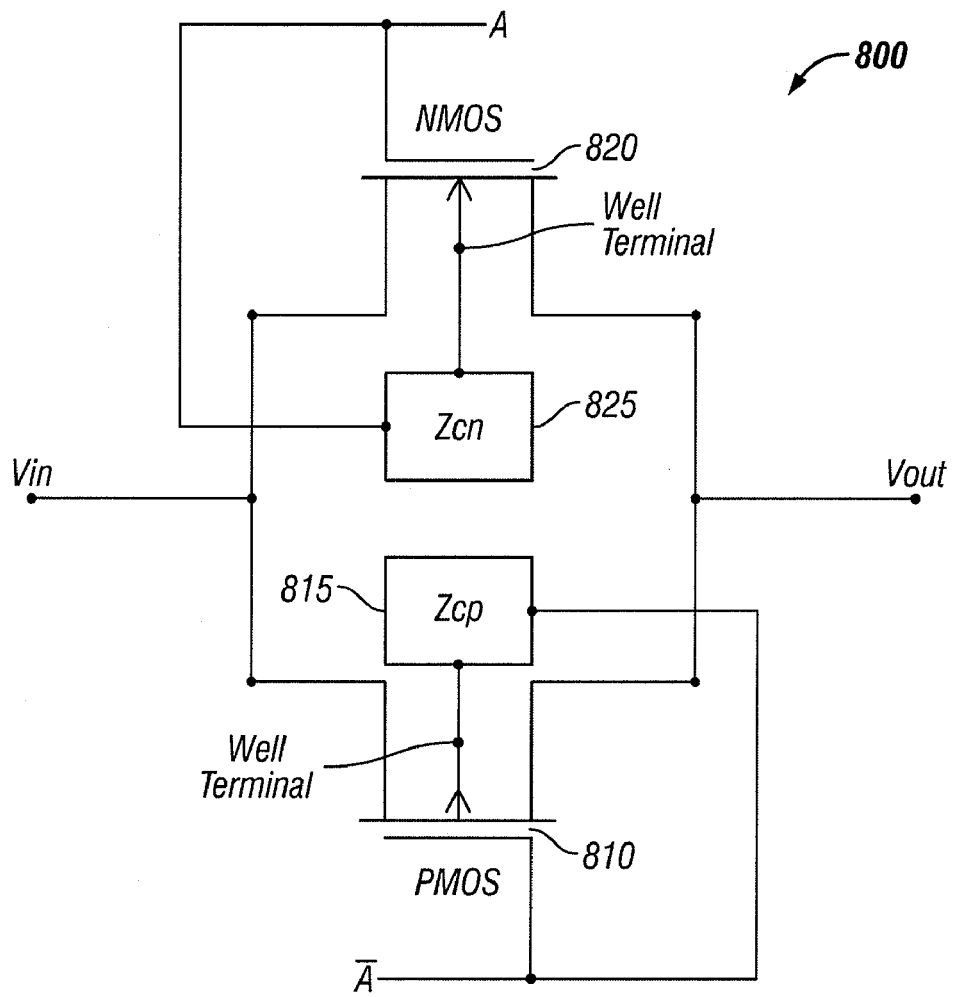
FIG. 8 is a diagram showing an exemplary implementation of the invention in a CMOS pass gate.

FIG. 8 is a schematic diagram 800 of a CMOS pass gate having a signal A that controls the status of the pass gate. The threshold levels of the NMOS transistor 820 are controlled by the control circuit $Z_{C_n}$ 825. The threshold levels of the PMOS transistor 810 are controlled by the control circuit $Z_{C_n}$ 815. The pass gate may comprise an NMOS transistor, for example the NMOS transistor 820, or a PMOS transistor, for example the PMOS transistor 810, having a corresponding non-linear threshold control device, as deemed appropriate for the specific application. The control circuits 815 and 825 are implemented in accordance with the invention and include at least a forward biased diode and a capacitor in parallel and as further explained below.

A person skilled in the art would note that, while the description provided herein is for VDD voltages below 1.5V, the same apparatus and method can be implemented with appropriate modifications for VDD voltages higher than that. Furthermore, the descriptions herein are provided as examples of the invention and by no means should be viewed as limiting the scope of the disclosed invention. While NMOS implementations are shown herein, the invention can also be used for PMOS transistors. The use of a control circuit, such as a diode, connected between the gate and the substrate, as described herein, may also be useful in conjunction with memory designs and, particularly, with memories that have significant leakages, such as random access memories (RAMS) and dynamic RAMs (DRAMs).

FIGS. 9A to 9D show a plurality of configurations of the control circuit $Z_C$ 260. The circuits can equally apply for use with both PMOS and NMOS transistors. Specifically, the circuits shown in FIGS. 9A-9D include, in addition to at least a diode as described in more detail above, at least a capacitor. The use of a capacitor in parallel with a diode in a circuit $Z_C$ according to the invention enables the waveform at the well terminal to be controlled. In the absence of the capacitor, the transient waveform of the well may be the subject of significant influence of the transient voltage at the output terminal, resulting in anomalous increase in leakage current under transient conditions. Therefore, the capacitor allows the well voltage to track the input voltage more accurately under transient conditions. Tracking help is needed because the tiny currents of the diodes do not move the well voltage quickly enough to allow full drive current for short pulses. In addition, counteracting the Miller effect is also a factor in the use and determination of the value of such a capacitor. Hence, in one embodiment of the invention a capacitor is connected in parallel to the diode as part of the control circuit $Z_C$ 260.

Figure 9A:
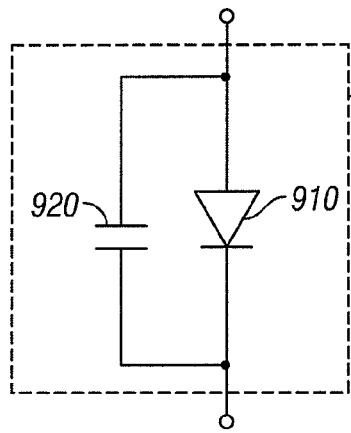
FIGS. 9A-9D are diagrams showing exemplary control circuits $Z_C$ implemented in accordance with the disclosed invention.

FIG. 9A shows a control circuit 260A in which a capacitor 920 is connected in parallel with a single diode 910.

Figure 10:
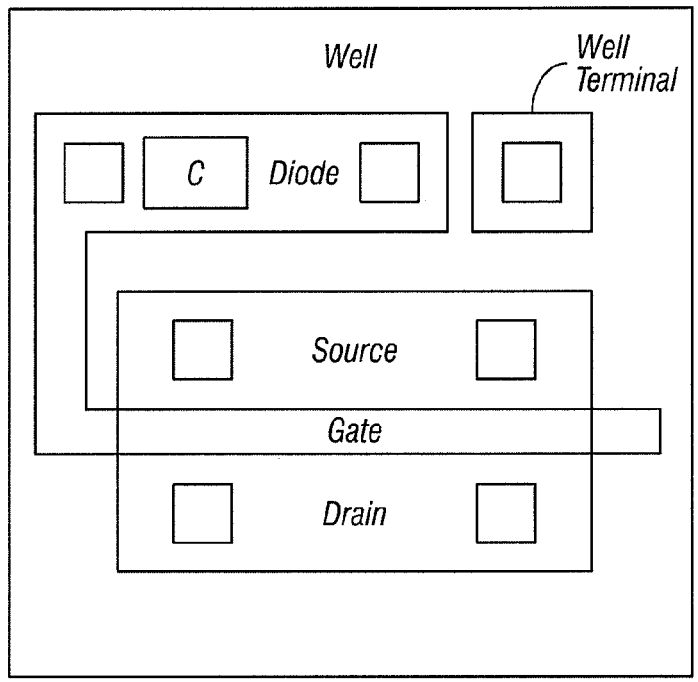
FIG. 10 is a diagram showing an exemplary layout of a control circuit $Z_C$ that includes a capacitor in accordance with the disclosed invention.

An exemplary and non-limiting circuit layout that includes a MOS transistor in combination with a control circuit 260A is shown in FIG. 10.

Figure 9B:
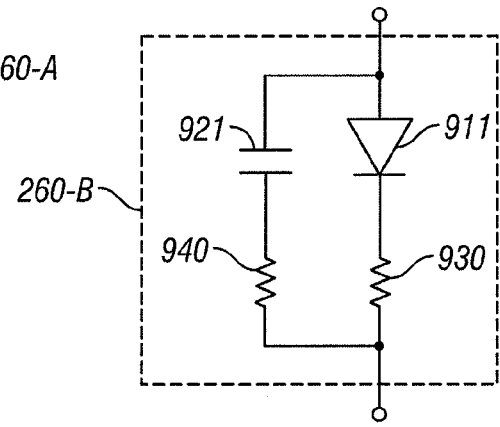

FIG. 9B shows a control circuit 260B in which a diode 911 is connected in series with a resistor 930, and a capacitor 921 is connected in series with a resistor 940.

Figure 9C:
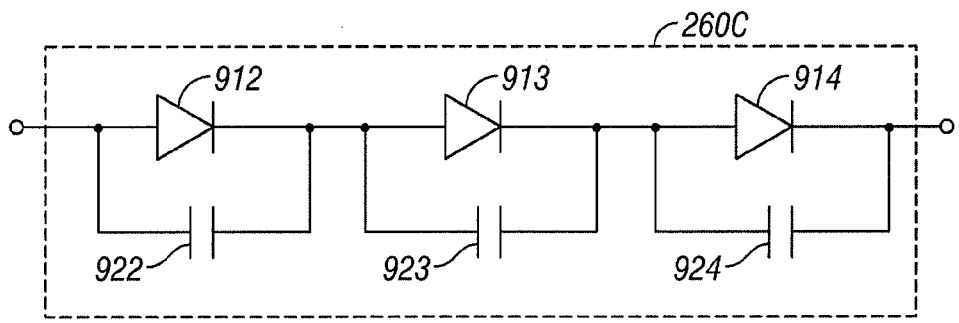

In FIG. 9C shows a control circuit 260C in which a plurality of diodes, for example diodes 912, 913, and 914, is each connected to a parallel capacitor, for example capacitors 922, 923, and 924, respectively. The actual number of diodes is determined by the exact circuit application.

Figure 9D:
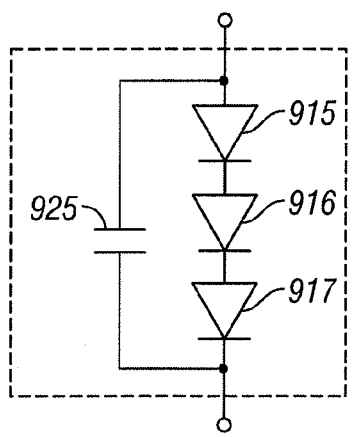

Another configuration employing multiple diodes is shown in FIG. 9D, in which a single capacitor 925 is shown connected in parallel with a plurality of diodes, for example diodes 915, 916, and 917. Each of these diodes and capacitors may be replaced by the same circuit element in series with a resistor,\ as shown, for example, with respect to FIG. 9B above. Any combination of these circuit elements in series and/or parallel can also be used for optimum circuit performance, and are specifically part of the disclosed invention. This is shown in FIG. 9D.

The preferred capacitor value for use in controlling the voltage waveform is related to the capacitance of the gate oxide. This capacitance value ranges between 0.01 to 100 times the value of the gate capacitance. An important factor in designing the feed-forward capacitor is the total capacitance of the well to other portions of the device. This capacitance is typically similar in magnitude to the gate capacitance. Ideally, the capacitance voltage division is identical to the voltage division established by the diodes.

In another embodiment of the invention, performance concerns may cause a deviation from that standard. Multiple methods can be used to realize this capacitance. The resistors and capacitors shown in FIG. 9 can be realized by many different methods. FIG. 10 shows the implementation of the control circuit with a capacitor in parallel to the diodes, where the capacitor is formed in the region marked C between polysilicon and an underlying thin oxide layer on top of the well region, which is electrically connected to the body of the NMOS transistor. In a preferred embodiment, the capacitor from p+ poly over a p-well and n+ poly over an n-well is preferred over a capacitor formed of n+ poly over p-well, and so on. The former approach is less likely to form an inversion layer which would reduce the dynamic capacitance. In an alternate embodiment, the capacitor is constructed using a metal-insulator-metal (MIM) implementation, known to those skilled in the art. These capacitors are formed by introducing a thin layer of oxide between two layers of metal. In yet another embodiment a metal-on-metal (MoM) capacitor is used, which is formed by the fringing capacitance between interdigitated metal fingers. The metal capacitors discussed herein have the advantage of not being in the same plane as other components of the circuit, and therefore do not contribute materially to the layout area.

Figure 11:
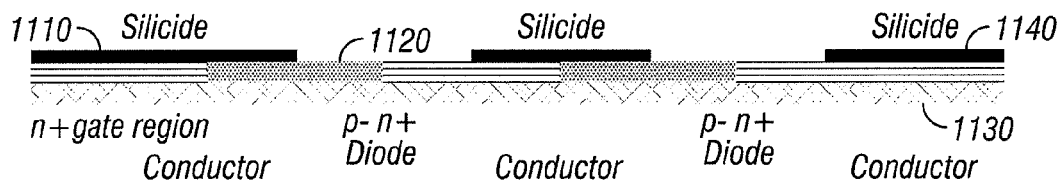
FIG. 11 is a cross-section diagram showing two lateral poly diodes.
Figure 12:
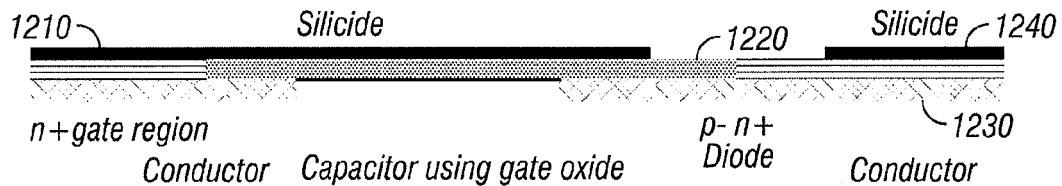
FIG. 12 is a cross-section diagram showing a capacitor and a single lateral poly diode.

FIGS. 11 and 12 show lateral poly diodes. These diodes may be used to form the control circuits discussed above. The formation of the diodes is discussed in detail in Vora et al. *A 2 Micron High Performance Bipolar 64 K ECL Static RAM*

*Technology With 200 Square Microns Contactless Memory Cell*, IEDM Technical Digest pp. 690-693, (1984), which is incorporated herein in its entirety by this reference thereto. FIG. 11 shows a pair of p– to n+ diodes which is incorporated deployed as part of the $Z_C$ network 260 for an NMOS transistor. The layer 1110 is n+ poly, the layer 1120 is p– poly and the layer 1130 is field oxide. FIG. 12 shows a similar structure for a capacitor and one lateral poly diode, where the layer 1210 is n+ poly, the layer 1220 is p– poly and the the layer 1230 is field oxide. In both cases, the contact to the relevant p-well is made from point 1140 or 1240, respectively.

Figure 13:
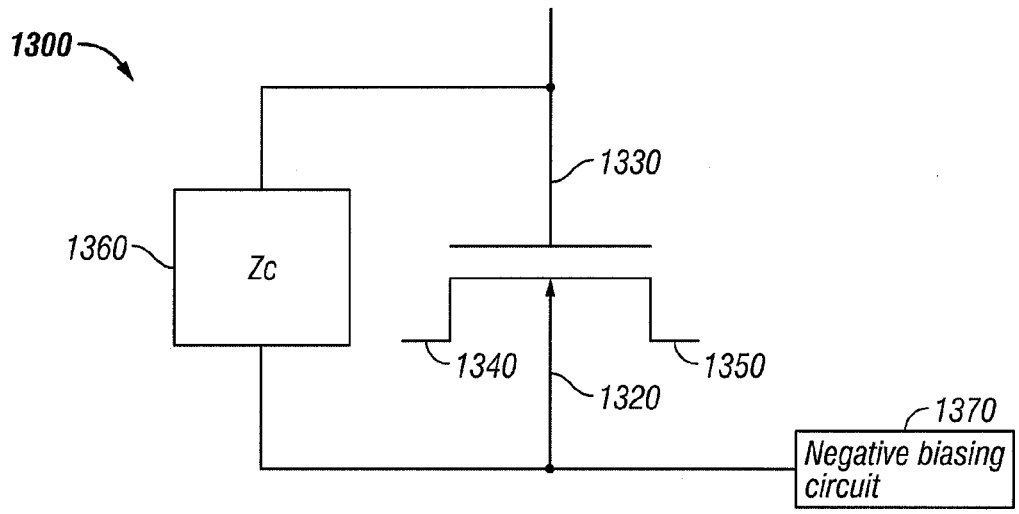
FIG. 13 is a schematic diagram of an exemplary implementation of a negative well bias in accordance with the disclosed invention.

FIG. 13 shows an embodiment of the invention having an additional circuit to implement negative bias on the p-well of an NMOS transistor. The elements 1320 through 1360 correspond to elements 220 through 260 of FIG. 2, respectively. In addition, a negative bias control 1370 is configured to provide a negative bias to the well 1320. The negative bias further reduces the threshold voltage of the PMOS transistor. The impact of applying negative bias on the threshold voltage of PMOS is well documented and known to those skilled in the art. Equivalently, for NMOS transistors, a positive bias is applied to increase the magnitude of its threshold voltage. The bias discussed herein is applied in such a manner that it does not interfere with the operation of the device. In an embodiment of the invention, the bias circuit 1370 is activated when there is no activity on the input 1330 of the MOS transistor. During the period when the input voltage at gate 1330 is expected to be varied, the negative biasing circuitry is disconnected from well 1320 by means of a negative bias control 1370.

Figure 14:
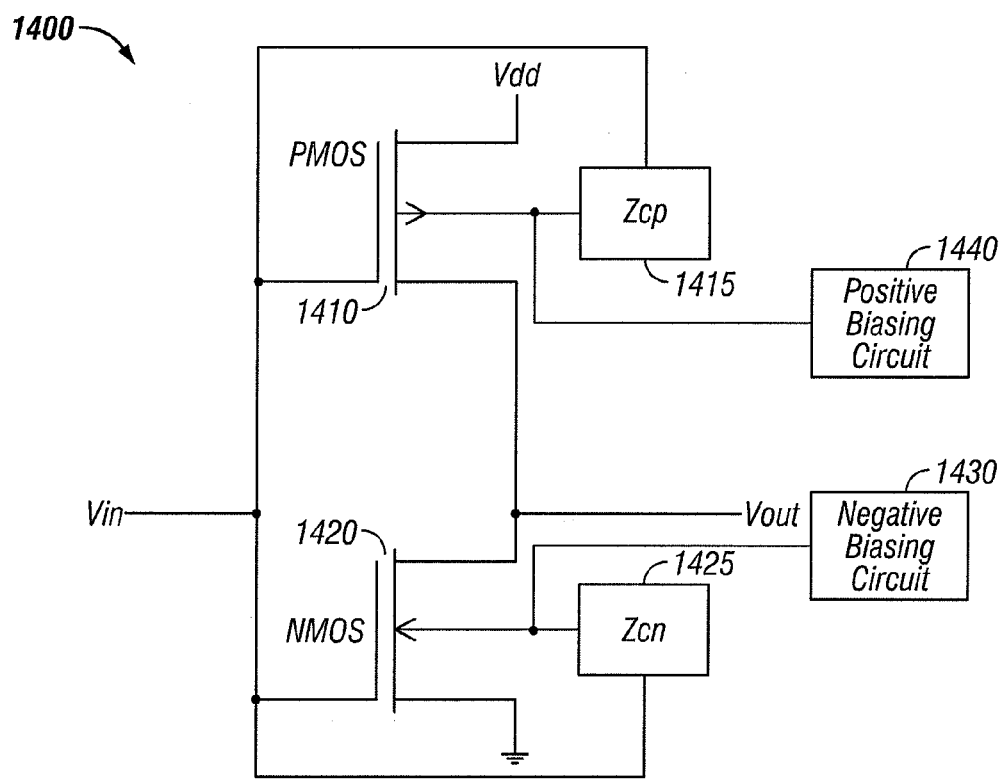
FIG. 14 is a diagram showing an exemplary implementation of a CMOS buffer using a positive well bias and a negative well bias in accordance with the disclosed invention.

FIG. 14 shows an embodiment of well biasing as it applies to a CMOS inverter. The various elements numbered 1400 through 1425 have the same description and function as elements 600 through 625, respectively, of FIG. 6. The bias controls 1430 and 1440 are circuit elements that to enable a negative voltage and a positive voltage to the wells of the PMOS and NMOS transistors, respectively when the inputs of the transistors are inactive. A person skilled in the art would realize that this configuration may be extended to other circuits without departing from the spirit of the invention and such circuits are hereby specifically included.

Where two or more of the same type MOS gates, for example n-channel gates, are connected in series, e.g. NAND gate, the leakage current from the MOS gates in series is significantly reduced. Similarly, in circuits where two or more p-channel gates are connected in series, e.g. NOR gate, the leakage current from the MOS gates in series is significantly reduced. In such cases, it may not be necessary to configure the MOS gates connected in series with the control circuit $Z_c$. However, for two or more MOS gates connected in parallel having a control circuit $Z_c$ for each of the MOS gates reduces their leakage current, as taught by the invention. In one embodiment of the invention the MOS gates connected in parallel share a common isolated well, i.e. P-well for n-channel devices and N-well for p-channel devices, and a single control circuit $Z_c$.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

The invention claimed is:

1. An apparatus for reducing leakage current and increasing drive current in a metal-oxide-semiconductor (MOS) transistor having a source terminal, a drain terminal, a gate terminal, and a well terminal, said apparatus comprising: a control circuit comprised of at least a forward biased diode formed in an isolated structure connected between said gate terminal and said well terminal of said MOS transistor;

wherein said control circuit effects an increase in the magnitude of the threshold voltage of said MOS transistor when said MOS transistor is in an OFF state and a decrease in the magnitude of the threshold voltage in said MOS transistor when said MOS transistor is in an ON state.

2. The apparatus of claim 1, wherein said control circuit controls a waveform at said well terminal.

3. The apparatus of claim 1, said MOS transistor comprising any of: an n-channel device; and a p-channel device.

4. The apparatus of claim 3, further comprising: a biasing circuit for providing a positive bias to the well of said n-channel device.

5. The apparatus of claim 3, further comprising: a biasing circuit for providing a negative bias to the well of said p-channel device.

6. The apparatus of claim 1, further comprising: a circuit comprising at least two n-channel devices having their respective drain terminals connected.

7. The apparatus of claim 6, further comprising: a biasing circuit for providing a positive bias to the well of said n-channel devices.

8. The apparatus of claim 7, wherein said at least two n-channel devices connected in parallel reside in the same P-well.

9. The apparatus of claim 8, said circuit comprising at least a portion of a logic gate.

10. The apparatus of claim 1, further comprising: a circuit comprising at least two p-channel devices having their respective drain terminals connected.

11. The apparatus of claim 10, further comprising: a biasing circuit for providing a positive bias to the well of said n-channel device.

12. The apparatus of claim 11, wherein said at least two p-channel devices connected in parallel reside in the same N-well.

13. The circuit of claim 10, said circuit comprising at least a portion of a logic gate.

14. The apparatus of claim 1, said control circuit comprising: at least a capacitor connected in parallel to said at least a forward biased diode.

15. The apparatus of claim 1, said first circuit element further comprising a resistor in series with said at least a forward biased diode.

16. The apparatus of claim 14, further comprising: a resistor in series with said a capacitor.

17. The apparatus of claim 1, said control circuit comprising of any of: a diffused diode, a self-aligned diode, an in-line polysilicon diode, and a Schottky diode.

18. The apparatus of claim 17, said polysilicon diode comprising a uniform implant and an opposite heavy implant.

19. The apparatus of claim 1, said MOS transistor comprising a well doping, wherein said well duping is optimized to reduce said leakage current.

20. The apparatus of claim 19, comprising an amount of said well doping that is higher than that used for a standard MOS process.

21. An apparatus for reducing leakage current and increasing drive current in a metal-oxide-semiconductor (MOS) transistor having a source terminal, a drain terminal, a gate terminal, and a well terminal, said apparatus comprising: a control circuit comprising a first circuit element comprising at least one forward biased diode, said first circuit element connected between said gate terminal and said well terminal of said MOS transistor; said control circuit further comprising a second circuit element connected in parallel with said first circuit element, said second circuit element comprising at least a capacitor; said control circuit effecting an increase in the magnitude of the threshold voltage of said MOS transistor when said MOS transistor is in an OFF state, and a decrease of the magnitude of the threshold voltage in said MOS transistor when said MOS transistor is in an ON state, and controlling a waveform at said well terminal of said MOS transistor; and said MOS transistor comprising any of an n-channel device and a p-channel device.

22. The apparatus of claim 21, further comprising: means for providing a positive bias to the well of said n-channel device.

23. The apparatus of claim 21, further comprising: means for providing a negative bias to the well of said p-channel device.

24. The apparatus of claim 21, said first circuit element further comprising: a resistor in series with said diode.

25. The apparatus of claim 21, said second circuit element further comprising: a resistor in series with said capacitor.

26. The apparatus of claim 21, further comprising: a well for said MOS transistor, wherein said well is doped to a level that optimizes said leakage current.

27. An apparatus for reducing leakage current and increasing drive current in a metal-oxide-semiconductor (MOS) transistor having a source terminal, a drain terminal, a gate terminal, and a well terminal, said apparatus comprising:
  a control circuit comprised of at least a forward biased diode formed in an isolated structure connected between said gate terminal and said well terminal of said MOS transistor, and wherein said control circuit controls a waveform at said well terminal;
  wherein said control circuit effects an increase in the magnitude of the threshold voltage of said MOS transistor when said MOS transistor is in an OFF state and a decrease of the magnitude of the threshold voltage in said MOS transistor when said MOS transistor is in an ON state.

28. The apparatus of claim 27, said MOS transistor comprising any of: an n-channel device; and a p-channel device.

29. The apparatus of claim 28, further comprising: means for providing a positive bias to the well of said n-channel device.

30. The apparatus of claim 28, further comprising: means for providing a negative bias to the well of said p-channel device.

31. The apparatus of claim 28, further comprising: a circuit comprising at least two n-channel devices connected in parallel.

32. The apparatus of claim 31, the logic gate further comprising: means for providing a positive bias to the well of said n-channel devices.

33. The apparatus of claim 32, wherein said at least two n-channel devices connected in parallel reside in the same P-well.

34. The apparatus of claim 33, said circuit comprising at least a portion of a logic gate.

35. The apparatus of claim 1, further comprising: a circuit comprising at least two p-channel devices connected in parallel.

36. The apparatus of claim 35, further comprising: means for providing a positive bias to the well of said n-channel device.

37. The apparatus of claim 36, wherein said at least two p-channel devices connected in parallel reside in the same N-well.

38. The circuit of claim 35, said circuit comprising at least a portion of a logic gate.

39. The apparatus of claim 27, said control circuit comprising: at least a capacitor connected in parallel to said at least a forward biased diode.

40. The apparatus of claim 27, said first circuit element further comprising a resistor in series with said at least a forward biased diode.

41. The apparatus of claim 39, further comprising: a resistor in series with said a capacitor.

42. The apparatus of claim 27, said control circuit comprising of any of: a diffused diode, a self-aligned diode, an in-line polysilicon diode, and a Schottky diode.

43. The apparatus of claim 42, said polysilicon diode comprising a uniform implant and an opposite heavy implant.

44. The apparatus of claim 27, said MOS transistor comprising a well doping, wherein said well duping is optimized to reduce said leakage current.

45. The apparatus of claim 44, comprising an amount of said well doping that is higher than that used for a standard MOS process.

46. An apparatus for reducing leakage current and increasing drive current in a metal-oxide-semiconductor (MOS) transistor having a source terminal, a drain terminal, a gate terminal, and a well terminal, said apparatus comprising:
  a control circuit comprising a first circuit element comprising at least one forward biased diode, said first circuit element connected between said gate terminal and said well terminal of said MOS transistor;
  said control circuit further comprising a second circuit element connected in parallel with said first circuit element, said second circuit element comprising at least a capacitor;
  said control circuit effecting an increase in the magnitude of the threshold voltage of said MOS transistor when said MOS transistor is in an OFF state, and a decrease in the magnitude of the threshold voltage of said MOS transistor when said MOS transistor is in an ON state, and controlling a waveform at said well terminal of said MOS transistor;
  said MOS transistor comprising any of an n-channel device and a p-channel device; and
  a means for providing one of:
    a positive bias to the well of said n-channel device; and
    a negative bias to the well of said p-channel device.

47. The apparatus of claim 46, said first circuit element further comprising: a resistor in series with said diode.

48. The apparatus of claim 46, said second circuit element further comprising: a resistor in series with said capacitor.

49. The apparatus of claim 46, further comprising: a well for said MOS transistor, wherein said well is doped to a level that optimizes said leakage current.

* * * * *